(12) United States Patent
Östergård

(10) Patent No.: US 7,295,189 B2
(45) Date of Patent: Nov. 13, 2007

(54) PRINTABLE ELECTROMECHANICAL INPUT MEANS AND AN ELECTRONIC DEVICE INCLUDING SUCH INPUT MEANS

(75) Inventor: Toni Östergård, Turku (FI)

(73) Assignee: Nokia Corporation, Espoo (FI)

( * ) Notice: Subject to any disclaimer, the term of this patent is extended or adjusted under 35 U.S.C. 154(b) by 651 days.

(21) Appl. No.: 10/749,062

(22) Filed: Dec. 29, 2003

(65) Prior Publication Data
US 2005/0146510 A1  Jul. 7, 2005

(51) Int. Cl.
*G06F 3/041* (2006.01)
(52) U.S. Cl. ...................... 345/173; 345/174
(58) Field of Classification Search ........ 345/173–175, 345/168, 169, 104, 156; 178/18.01–18.07, 178/19.01–19.03
See application file for complete search history.

(56) References Cited

U.S. PATENT DOCUMENTS 4,954,673 A * 9/1990 Miller .................... 200/61.43
6,356,451 B1 * 3/2002 Nakagawa et al. ......... 361/760
6,501,528 B1 12/2002 Ryohei
6,751,898 B2 * 6/2004 Heropoulos et al. .......... 40/544
2005/0041002 A1 * 2/2005 Takahara et al. ............. 345/76

FOREIGN PATENT DOCUMENTS

JP  2000112639  4/2000

* cited by examiner

*Primary Examiner*—Ricardo Osorio
(74) *Attorney, Agent, or Firm*—Alfred A. Fressola; Ware, Fressola, Van Der Sluys & Adolphson LLP

(57) ABSTRACT

Electromechanical input means for a portable electronic device comprise first and second layers of conductive or resistive material. The second layer overlaps the first layer at least partly so that the overlapping parts of the first and second layers together are responsive to touching or pressing to produce an electric input signal to the portable electronic device. There is a dielectric support layer for the first and second layers. At least a part of the dielectric support layer for the first layer continues past the first layer and is bent back to act as the dielectric support layer for the second layer.

16 Claims, 7 Drawing Sheets

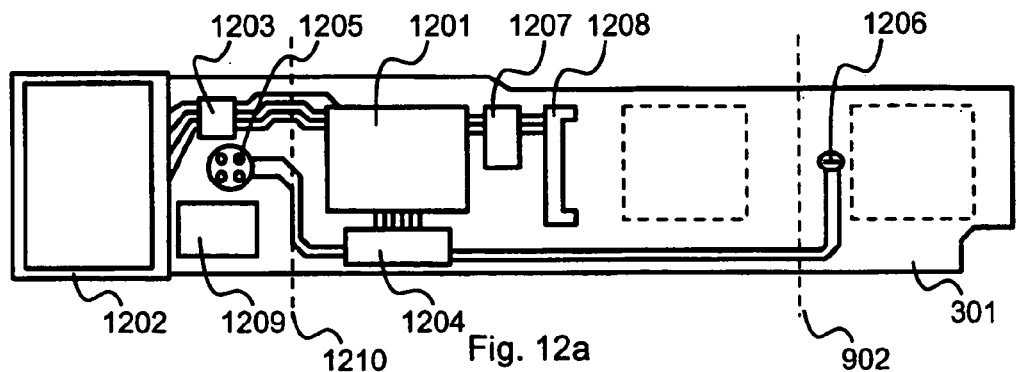
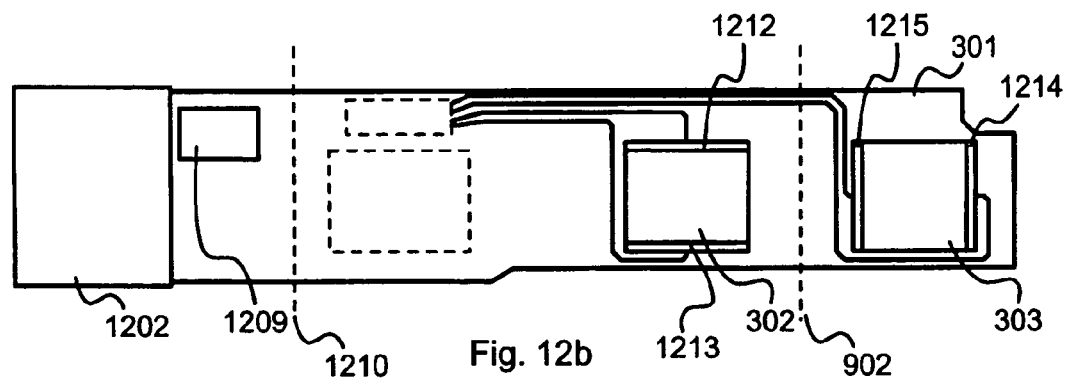
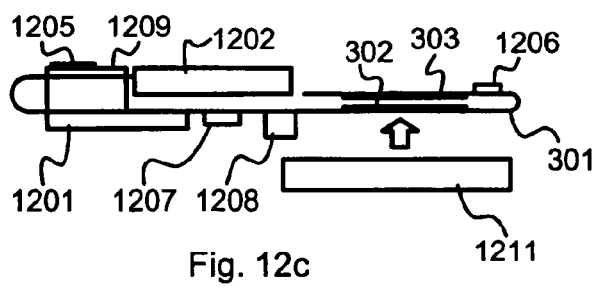
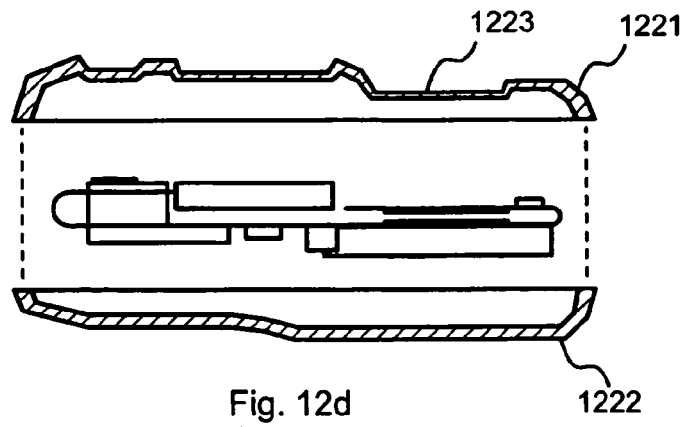

PRINTABLE ELECTROMECHANICAL INPUT MEANS AND AN ELECTRONIC DEVICE INCLUDING SUCH INPUT MEANS

TECHNICAL FIELD

The invention generally concerns the structures of electromechanical input means used to input data into compact-size electronical devices. Especially the invention concerns a novel electromechanical structure that facilitates advantageous physical implementation of touch pad and key pad type input means.

BACKGROUND OF THE INVENTION

Electronic devices such as computers, personal digital assistants, portable telephone devices and the like all need input means for enabling a human user to input commands and other information. The most commonly used input means comprise key pads and touch pads. Both of these involve the concept of producing an electric signal as a response to a pressing movement made by the user; the difference between the two is mainly in that a key pad only offers a relatively small number of discrete pressing points or keys to be pressed, while a touch pad is capable of differentiating between a large number of pressing locations and can even provide truly continuous detection of movement of the depression across the pressable surface. The borderline between the two is not always very obviously discernible.

FIG. 1 is an exploded cross-sectional view of a representative prior art key pad structure. A supporting structural part of the key pad is a printed circuit board 101. On its top surface it has a layer 102 of conductive patterns that at certain locations constitute patches 102a of intertwined fingers. The conductive patterns are covered with a perforated insulating layer 103, the holes of which coincide with the patches 102a. On top of the conductive layer there is the so-called domesheet 104, the domes of which are conductive on their concave side. Each dome is covered with an elastic key hat 105, and the whole arrangement is enclosed within an outer cover part 106 so that the key hats 105 protrude through respective holes in the outer cover part 106. Pressing a key hat 105 will cause a central part of the dome under it to bulge downwards, so that it forms an electrically conductive connection at one of the patches 102a. A piece of reading electronics (not shown) is coupled to the conductive patterns 102 and adapted to detect, at which patch 102a did the connection occur. Said reading electronics translate this location information into an unambiguous electronic input signal.

Touch pad input means come in a large variety of types, even including technical solutions that are relatively far from each other. FIG. 2 illustrates schematically a layered structure that can be used, with few modifications, for realizing a resistively coupling or a capacitively coupling touch pad. On the top surface of a printed circuit board 201 there is an essentially uniform resistive layer 202, the opposing edges of which are equipped with conductive electrodes 203 and 204. The term "resistive" is used to describe a material that is neither an insulator nor a conductor, but has a specific electric resistance that can be utilized to detect, how far did an electrical current have to propagate within said material. On top of the resistive layer 202 there comes an isolation web 205 and a second resistive layer 206, which also has conductive electrodes 207 and 208 running along its opposite sides. The electrodes 207 and 208 of the second resistive layer 206 are located at different sides of the generally rectangular form of the resistive layers 202 and 206. The whole arrangement is covered with a protective outer layer 209.

In the touch pad of FIG. 2 the isolation web 205, the second resistive layer 206 and the outer layer 209 are all elastically deformable to some extent. When the user presses some point of the outer layer 209 with the point of a stylus or other pressing means, an essentially point-like elastic deformation occurs that causes that point of the second resistive layer 206 to approach the first-mentioned resistive layer 202. In a galvanically coupling touch pad the deformation is large enough to cause the resistive layers to actually touch each other, while in a capacitively coupling touch pad it suffices to locally reduce the distance between the resistive layers so that the local change in capacitance between the resistive layers is large enough to be detected. In any case a piece of detection electronics (not shown) is coupled to the electrodes 203, 204, 207 and 208 and adapted to measure the resistive or capacitive characteristics of the created connection. Correlating the two simultaneous measurements obtained from the resistive layers 202 and 206 it is possible to deduce the location at which a depression occurred.

Using continuous electrodes along the whole length of sides of the resistive layers is not the only possible alternative for coupling the resistive layers to reading electronics. Some other solutions employ discrete conductive wires connected to specific points along the sides of the resistive layers, or even to certain intermediate points within the resistive layers.

More seldom encountered touch pad technologies involve e.g. detecting a change in acoustic vibrations caused by the pressing means, or using a light-emitting stylus and observing the way in which light coming from the stylus tip propagates in a light guide that forms a part of the layered structure of the display. It is highly probable that new technological ideas continue to surface regarding the fundamental way in which an active layer translates a touch or a depression into an electrical signal representing its location of occurrence.

The drawbacks of prior art key pads and touch pads are mainly related to the relatively large number of separate components and/or method steps required in their manufacture. As an example we may consider the touch pad structure of FIG. 2. The printed circuit board 201, the isolation web 205, the second resistive layer 206 and the protective outer layer 209 are all separate components that must be manufactured, brought into an assembling machine, aligned properly, and attached to each other. Electrical connections must be established from the electrodes 203, 204, 207 and 208 to the reading electronics. For lowering the manufacturing costs in mass production a simpler structure would be desirable.

SUMMARY OF THE INVENTION

It is an objective of the present invention to present an structure for electromechanical input means that is simple and only requires a small number of different parts and manufacturing steps. An additional objective of the invention is to provide a structure of the above-mentioned kind that is widely adaptable for use in different kinds of electromechanical input means. A further objective of the invention is to present a method for manufacturing structurally simple electromechanical input means, particularly for portable electronic devices. A yet further objective of the invention is to present an overall structural solution for a portable electronic device that includes electromechanical input means of the kind mentioned above.

The objectives of the invention are achieved by using a common support structure for at least two layers of the electromechanical input means, so that it becomes possible to produce said at least two layers onto the support structure in a single processing step, after which said at least two layers can be stacked together by mechanically deforming said support structure.

Electromechanical input means according to the invention comprise:
- a first layer of conductive or resistive material,
- a second layer of conductive or resistive material, which second layer at least partly overlaps the first layer so that the overlapping parts of the first and second layers together are responsive to touching or pressing to produce an electric input signal to the portable electronic device,
- a dielectric support layer for the first layer, and
- a dielectric support layer for the second layer;

wherein at least a part of the dielectric support layer for the first layer continues past the first layer and is bent back to act as the dielectric support layer for the second layer.

The invention applies also to an electromechanical functional module for a portable electronic device, which comprises:
- a flexible printed circuit board for supporting electronic components and conductive tracks between electronic components,
- a first layer of conductive or resistive material on a surface of the flexible printed circuit board, and
- a second layer of conductive or resistive material on a surface of the flexible printed circuit board;

wherein a portion of the flexible printed circuit board separates the first layer from the second layer, thus allowing the flexible printed circuit board to be bent around an imaginary axis crossing said portion of the flexible printed circuit board, so that after bending the second layer comes to at least partly overlap the first layer, and the overlapping parts of the first and second layers together are then responsive to touching or pressing to produce an electric input signal to the portable electronic device.

The invention applies also to a portable electronic device, which comprises:
- a flexible printed circuit board,
- an engine module, which is a microprocessor, attached and electrically connected to the flexible printed circuit board, and
- electromechanical input means for producing electric input signals for the engine module;

wherein the electromechanical input means comprise a first layer of conductive or resistive material on a surface of the flexible printed circuit board, and a second layer of conductive or resistive material on a surface of the flexible printed circuit board, which second layer at least partly overlaps the first layer, and wherein the flexible printed circuit board acts as a dielectric support layer for the first layer and continues past the first layer and is bent back to act as the dielectric support layer for the second layer.

Additionally the invention applies to a method for manufacturing electromechanical input means. The method comprises the steps of:
- producing a first layer of conductive or resistive material onto a surface of a dielectric support layer,
- producing a second layer of conductive or resistive material onto a surface of the same dielectric support layer, into a non-overlapping location with said first layer,
- producing conductive connections onto said dielectric support layer to facilitate conveying electric input means produced in said first and second layers to other parts of the portable electronic device and
- bending the dielectric support layer into a position in which said first and second layers at least partly overlap each other.

The resistive or conductive patterns and layers that constitute an important functional part of electromechanical input means seldom have sufficient mechanical and other properties to support themselves in the structure. A dielectric support structure, or alternatively a support structure of any conductive property from which the resistive or conductive patterns and layers are electrically isolated, is thus required. Most advantageously at least partly the same support structure is used both during manufacturing the resistive or conductive patterns and layers and also in the completed device.

A material that has proven to have many advantageous properties as a support structure is flexible printed circuit board, commonly referred to shortly as flex. It comprises a dielectric layer or a stack of sandwiched dielectric layers, typically made of polyimide or other polymeric isolation material, and an arrangement of conductive paths, vias and connection patches patterned upon the dielectric layer(s) for attaching electronic components and for connecting such attached electronic components conductively to each other.

According to the invention, electromechanical input means that comprise at least two resistive and/or conductive layers are manufactured by first producing said two layers onto a flex and then mechanically deforming said flex to make said two layers at least partly overlap with each other. This basic principle can be utilized in a variety of ways, giving rise to a number of embodiments of the invention, which can be classified according to e.g. whether a touch pad or key pad is produced.

A first class of embodiments involves producing a touch pad that has two conductive or resistive layers separated from each other by resilient isolation means. The two conductive or resistive layers can be produced close to each other on the same side of a flex, which at this stage is still straight and flat. Any patterning process can be used, including but not being limited to vacuum deposition processes, ink jet printing, screen printing and photolithography. All electrical connections that are needed to connect parts of the conductive or resistive layers to each other and/or to reading electronics are also produced onto the various surfaces of the flex, using possibly also the surfaces of intermediate layers if a so-called multilayer flex is used. The resilient isolation means most advantageously constitute a layer that can be similarly produced on top of at least one of the conductive or resistive layers in the patterning process. After said layers have been produced, the flex is bent between the two conductive or resistive layers, so that these end up facing each other with only the resilient isolation means therebetween. This layered structure is ready to be used as the central part of a touch pad. In some specific embodiments even the separate provision of any layer for acting as resilient isolation means can be omitted.

The conductive or resistive layers can be essentially continuous, in which case the result is an analog touch pad in which the output signal is a continuous function of depressing location, and the detection electronics must be designed accordingly. As an alternative at least one of the conductive or resistive layers may comprise a striped pattern, so that the task of detecting the location of a depression is at least partly reduced to simply detecting, in which stripe did the resulting connection occur. Both galvanically coupling and capacitively coupling touch pads may be produced.

A second class of embodiments involves producing a key pad, in which there are only a limited number of allowable pressing locations. In these embodiments there are certain patterns in the conductive or resistive layers that constitute the switching points corresponding to and coinciding with said pressing locations. It is even possible to cause a permanent mechanical deformation in the part of the flex that constitutes the support structure for one of the layers, causing a number of resilient domes to appear. These can be utilized to provide a more convenient tactile feeling to using a key pad according to an embodiment of the invention.

BRIEF DESCRIPTION OF DRAWINGS

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

FIGS. 12a-12d illustrate a portable electronic device according to an embodiment of the invention.

DETAILED DESCRIPTION OF THE INVENTION

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

Figure 1:
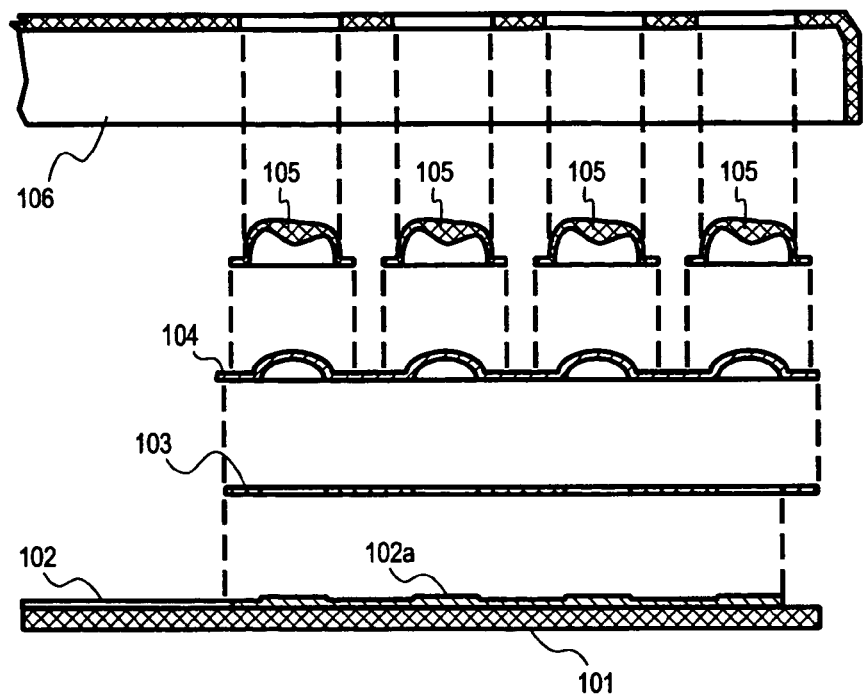
FIG. 1 illustrates a prior art key pad structure.
Figure 2:
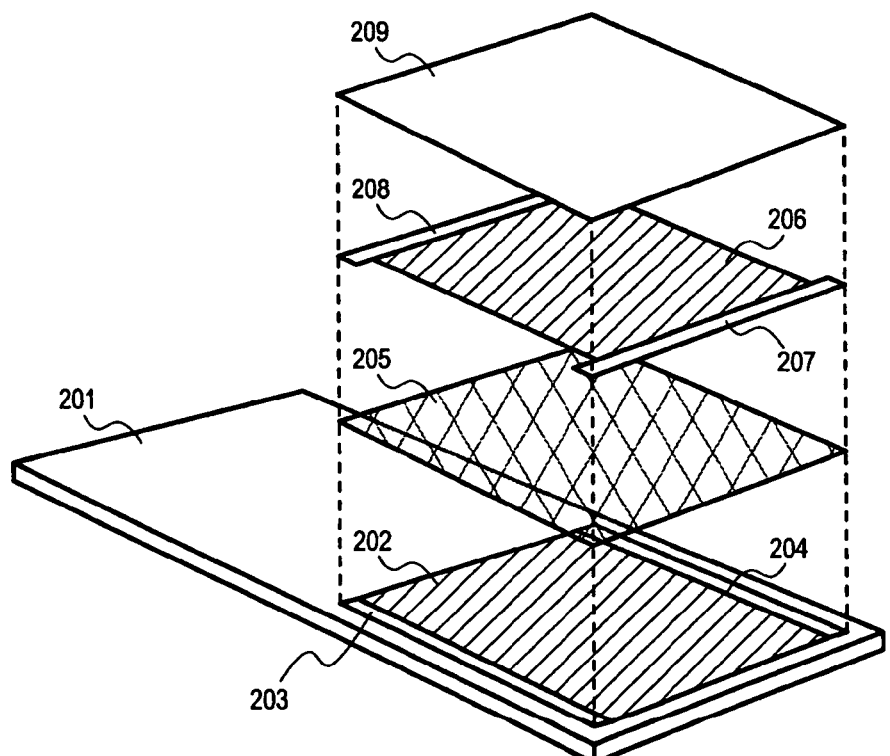
FIG. 2 illustrates a prior art touch pad structure.
Figure 3:
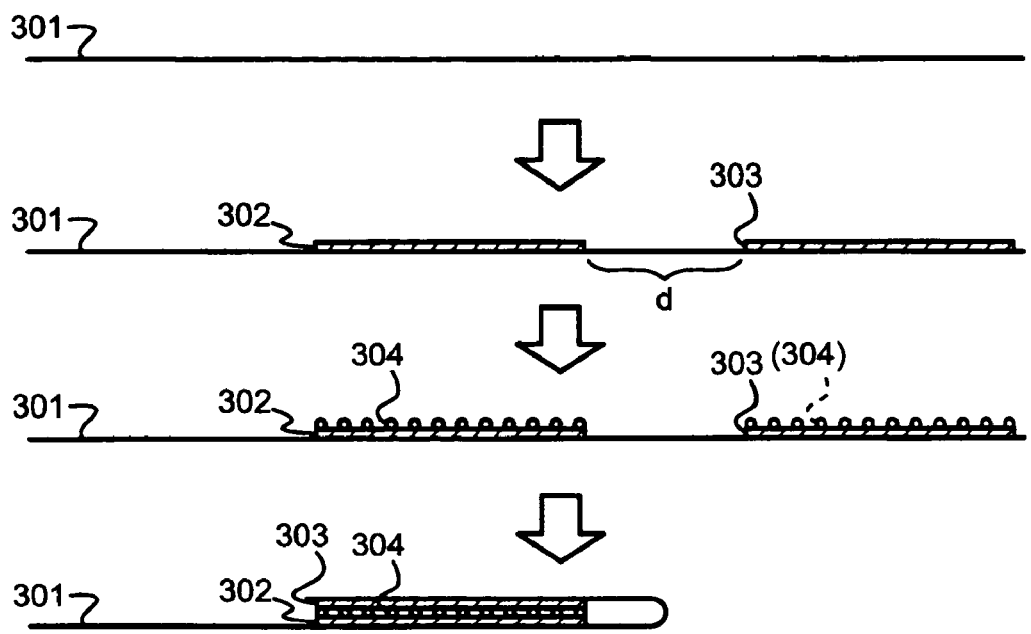
FIG. 3 illustrates a structural principle for a touch pad type embodiment of the invention.

FIG. 3 illustrates schematically how certain electromechanical input means according to an embodiment of the invention are manufactured. First there is a flex 301, which at this stage may already comprise a number of conductive patterns, vias, and attached components (these are not shown for graphical clarity). A first layer 302 and a second layer 303, which both are conductive or resistive, are produced onto one surface of the flex 301 relatively close to each other. The distance d between the first and second layers 302 and 303 is long enough to allow bending the flex 180 degrees around an imaginary axis that is close to the surface of the flex 301, at the midway between the first and second layers 302 and 303, and perpendicular to a shortest imaginary line connecting the first and second layers 302 and 303. Minimum values for the distance d are easily found from technical specifications of flex materials.

In the next step shown in FIG. 3 an additional layer 304 is produced on top of one of the first and second layers; here on top of the first layer 302. The additional layer 304 is to act as resilient isolation means in the completed structure. Consequently it must be web-like or consist of isolated spacer dots if the structure is to constitute a galvanically coupling touch pad, or compressible enough if the structure is to constitute a capacitively coupling touch pad. From the manufacturing point of view it is most advantageous if the additional layer 304 can be produced in a process step that is as similar as possible to, or at least technically as compatible as possible with the process step in which the first and second layers 302 and 303 were produced. That means that if e.g. a printing process of some kind was used to produce the first and second layers 302 and 303, it is most advantageous if also the additional layer 304 can be produced by printing. However, even embodiments where a completely different process step is used to produce the additional layer 304 are within the scope of the invention: examples include but are not limited to using a spraying gun to distribute a liquid layer that will solidify into place, or using the actuator arm of an industrial robot to sow a number of discrete separator pieces onto at least one of the first and second layers 302 and 303.

In the last step shown in FIG. 3 the flex 301 is bent to bring the second layer 303 into exact coincidence with the stack consisting of the first layer 301 and the additional layer 304. The resulting structure would have been essentially the same even if the additional layer 304 had been produced onto the second layer 303, or even if the additional layer 304 had been produced partly onto the first layer 302 and partly onto the second layer 303. This last-mentioned fact is illustrated by the reference designator 304 in parentheses in FIG. 3.

Whether the first and second layers 302 and 303 are continuous or web-like or whether they consist of differently directed striped patterns or other detection-enabling forms is not important to the present invention. Neither is the fact whether the resulting touch pad is of the galvanically coupling or the capacitively coupling type. These are all considerations that relate to previously known variations of touch pads. It would be well within the capability of the person skilled in the art to select the appropriate layer composition, material and thickness as well as the correct type of reading electronics, according to system level requirements.

Figure 4:
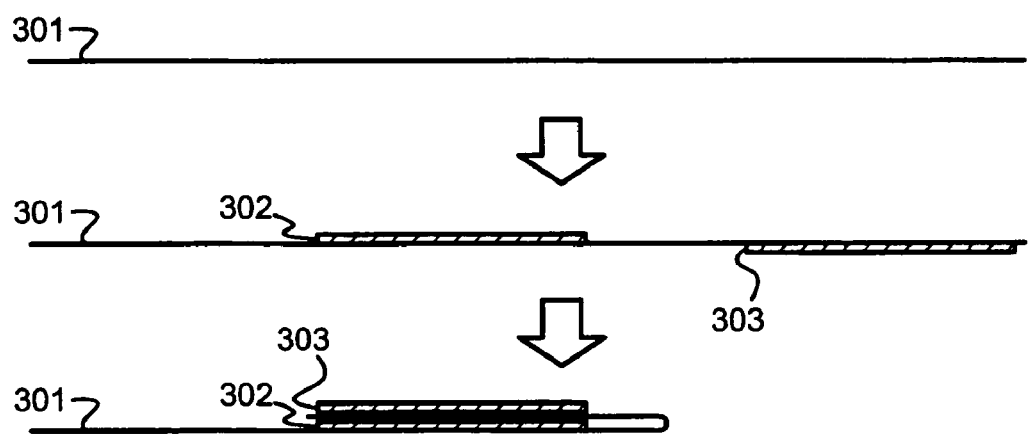
FIG. 4 illustrates an alternative structure for a touch pad type embodiment of the invention.

FIG. 4 illustrates an alternative embodiment of the invention in which separate resilient isolation means are not needed. The first layer 302 and the second layer 303 are produced on different sides of the flex 301, and the flex is subsequently bent to form a stack in which a part of the flex 301 remains between the first and second layers 302 and 303. For this embodiment of the invention to work it is necessary that the material of the flex is compressible enough so that pressing one point of the resulting stack of layers will cause the first and second layers 302 and 303 to locally approach each other enough to cause e.g. a distinctive capacitive coupling through the flex material. It is possible to combine the "different sides" embodiment of FIG. 4 with the use of separately produced resilient isolation means, if the compressibility of the flex is not sufficient; in that case an additional layer (not shown in FIG. 4) acting as the resilient isolation means should be produced on top of the first layer 302 or between the flex 301 and the second layer 303.

Figure 5:
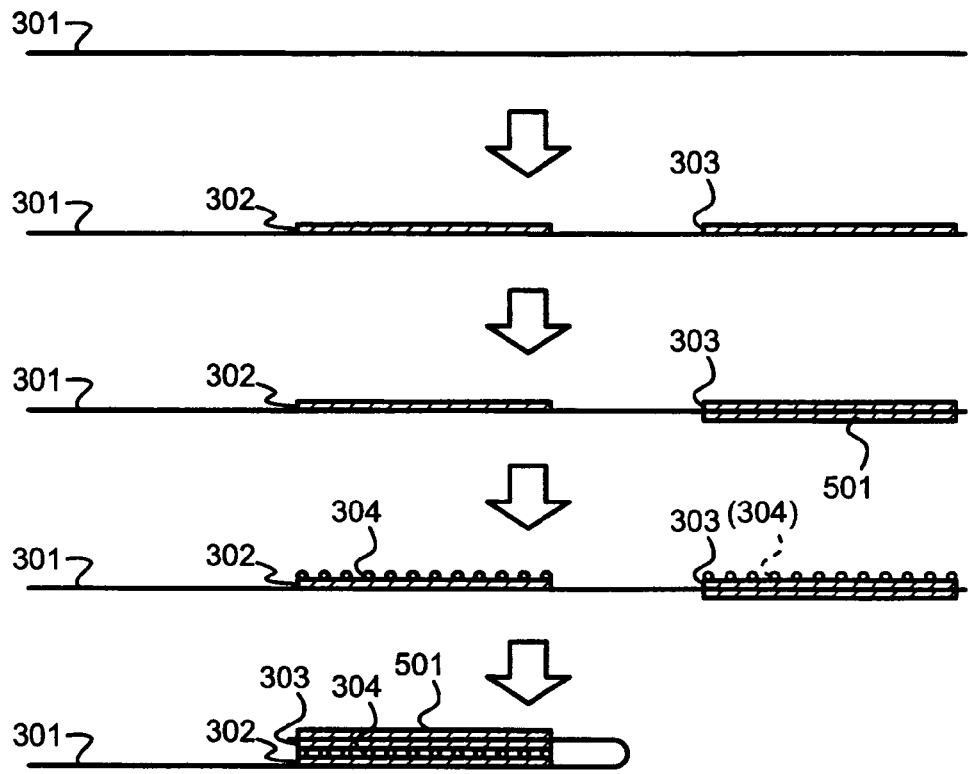
FIG. 5 illustrates yet another alternative structure for a touch pad type embodiment of the invention.

The layers that take part in the constitution and operation of the touch pad are not limited to the first and second layers 302 and 303 and the additional layer 304 that acts as resilient isolation means. FIG. 5 illustrates how there are first produced the first and second layers 302 and 303 onto one surface of the flex 301. A third layer 501 is produced onto the opposite surface of the flex 301 so that it coincides spatially with the second layer 303. The order of the layer-forming steps could easily be changed so that the third layer 501 was produced first and the first and second layers 302 and 303 only thereafter. An additional layer 304, which in the completed structure will act as the resilient isolation means, is produced on top of at least one of the first and second layers 302 and 303. Then the flex is bent to bring all layers into stacked formation, in which the layers are from top to down the third layer 501, the flex 301, the second layer 303, the additional layer 304, the first layer 302 and the flex 301.

The purpose of the third layer 501 in the structure is not limited by this invention. For example, it may be just a grounded conductive layer that forms a part of an EMI (electromagnetic interference) shielding arrangement or shielding against static discharges. On the other hand it may also have a clear functional task as a part of the touch pad, if the touch pad employs e.g. some multilayer principle in which location information is collected from more than two layers. In the latter case it must be noted that certain specific compressibility requirements may apply to the material of the flex, if the process of producing and detecting location information requires the touch or depression to cause some local interaction between the second and third layers 303 and 501.

Figure 6:
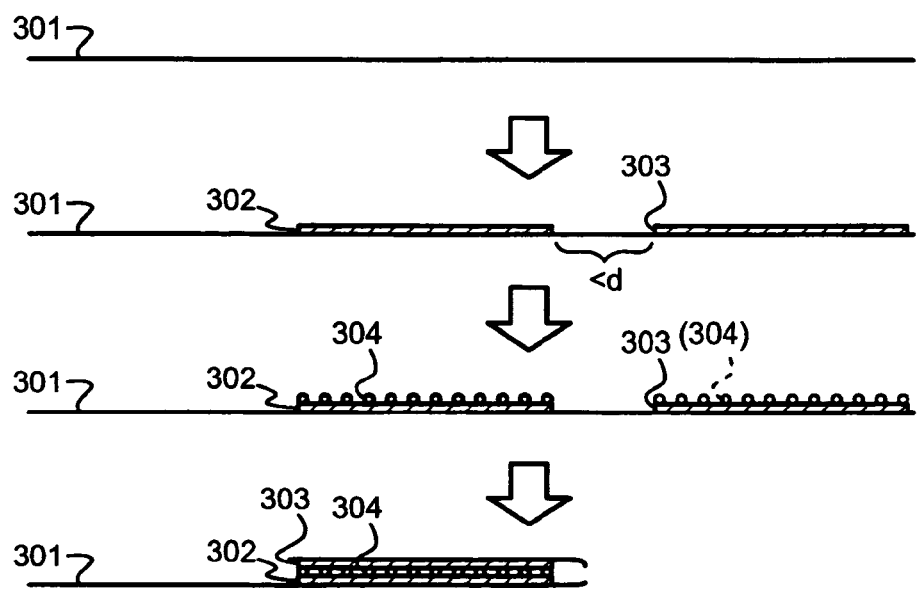
FIG. 6 illustrates yet another alternative structure for a touch pad type embodiment of the invention.

FIG. 6 illustrates an alternative touch pad embodiment in which the first and second layers 302 and 303 are originally produced closer to each other on the flex than the minimum separation d that would allow safely bending the flex. Prior to or in association with the bending step the flex is purposefully cut between the first and second layers 302 and 303. This embodiment is especially applicable to structures where no electrical connections to the second layer 303 are needed, because cutting the flex will naturally preclude continuous galvanic connections. In comparison to prior art solutions where the layers of the touch pad were independently manufactured, first manufacturing the first and second layers 302 and 303 onto the common support structure (the flex 301) and only thereafter separating them from each other offers the advantage of facilitating easier handling of the components during those process steps where the layers are produced.

Figure 7:
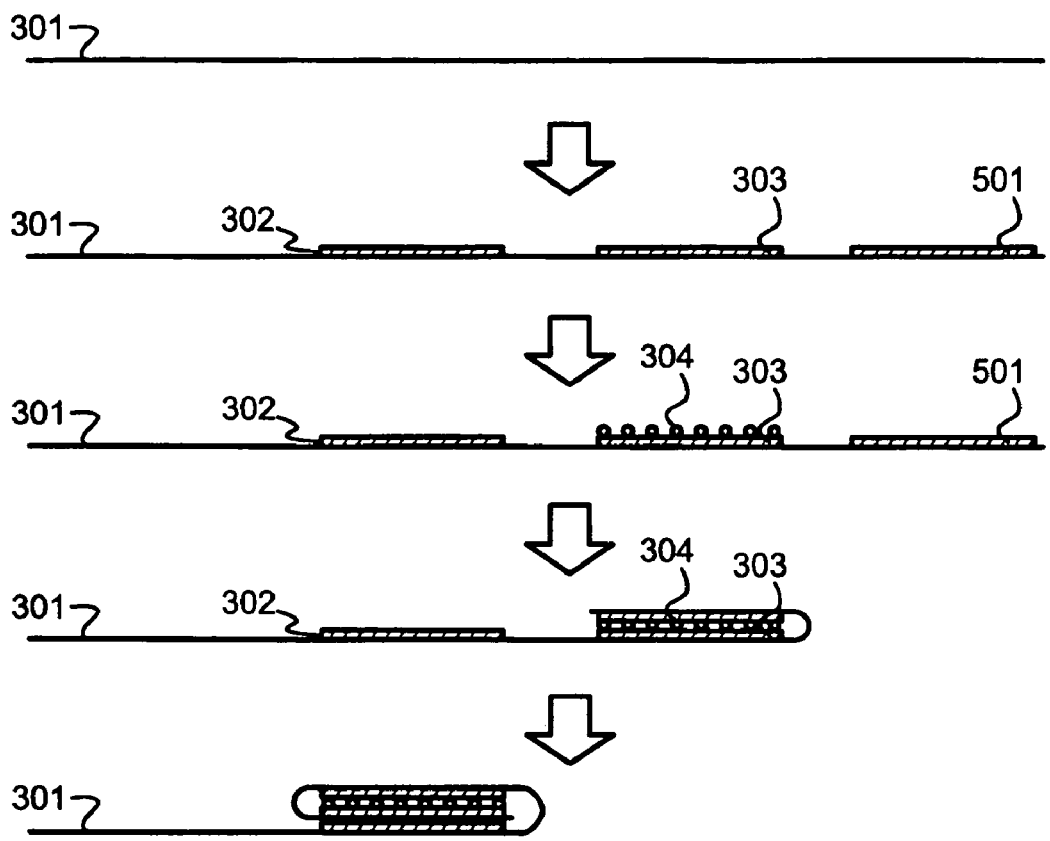
FIG. 7 illustrates yet another alternative structure for a touch pad type embodiment of the invention.

FIG. 7 illustrates yet another multilayer touch pad type embodiment of the invention. In the structure illustrated therein, there are first produced the first and second layers 302 and 303 as well as a third layer 501, all onto the same side of the flex 301. An additional layer 304 is produced onto the second layer 303; it could also be produced onto the third layer 501. The flex 301 is first bent once 180 degrees around an imaginary axis midway between the second and third layers 303 and 501, which brings said layers into a stacked configuration, with the additional layer 304 acting as resilient isolation means therebetween. Then the flex 301 is bent again 180 degrees, this time around an imaginary axis midway between the first and second layers 302 and 303. Before the last bending it would have been possible to produce yet another additional layer (not shown) onto the first layer 302 (or even originally between the flex 301 and the third layer 501). In the resulting stack there are, from top to down, the flex 301, the second layer 303, the additional layer 304, the third layer 501, the flex 301 again, the first layer 302 and the flex 301 yet again.

Figure 8:
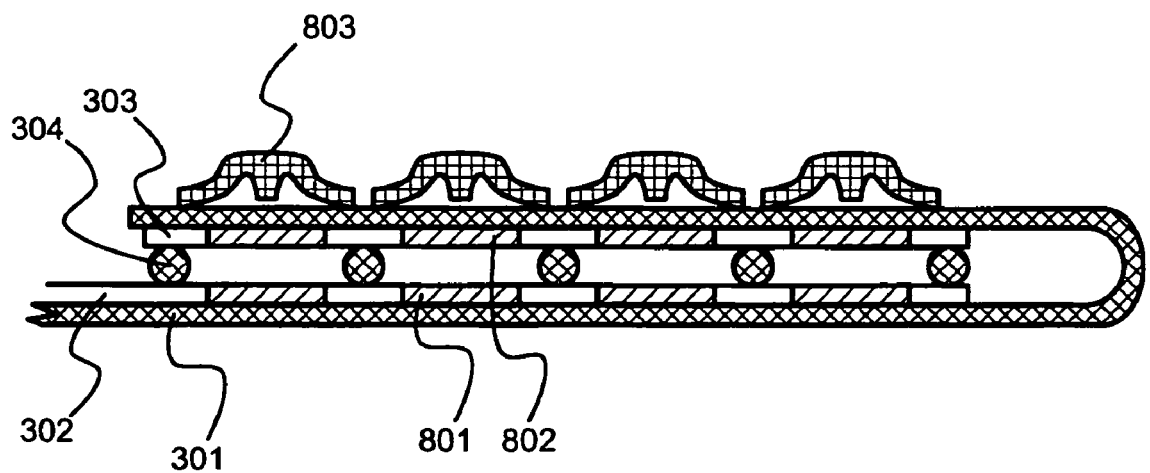
FIG. 8 illustrates a structural principle for a key pad type embodiment of the invention.

We will now move on to describe the key pad type embodiments of the invention. FIG. 8 is a cross-sectional view through a key pad type embodiment of the invention. The common support structure for conductive or resistive layers is again a flex 301. There is a first layer 302, which in this case is particularly conductive and comprises a matrix arrangement of contact pads 801. For persons that are used to working with key pads it is most natural to think about the contact pads 801 being located in a regular matrix arrangement, although the invention naturally does not exclude them from being in whatever arrangement. The end of the flex 301 that has been bent over to cover the first layer 302 comprises a second layer 303, which also is particularly conductive in this embodiment and comprises contact pads 802, the locations of which correspond to the locations of the contact pads 801 of the first layer 302. There is an additional layer 304 that acts as resilient isolation means and keeps the first and second layers 302 and 303 (and particularly the contact pads 801 and 802) from touching each other when no pressing forces exist. The additional layer 304 has openings at the locations of the contact pads 801 and 802; the additional layer 304 could also consist of separate spacer particles, none of which is located on any of the contact pads 801 and 802.

The stacked configuration of layers consists of, from top to down, the flex 301, the second layer 303, the additional layer 304, the first layer 302 and again the flex 301. On top of this stacks there are key hats 803 that can be separate from each other or constitute a continuous key mat. Each key hat 803 is located on top of a pair of contact pads 801 and 802. There are typically other structural parts such as outer cover parts to hold the key hats 803 in place and to allow them to move in the vertical direction, but such other structural parts are not shown in FIG. 8 for graphical clarity. The idea is that when a key hat 803 is pressed, the actuator on its lower side causes a local deformation in the flex part directly under it, whereby the corresponding contact pad 802 of the second layer 303 bends downwards and touches the corresponding contact pad 801 of the first layer 302.

Figure 9:
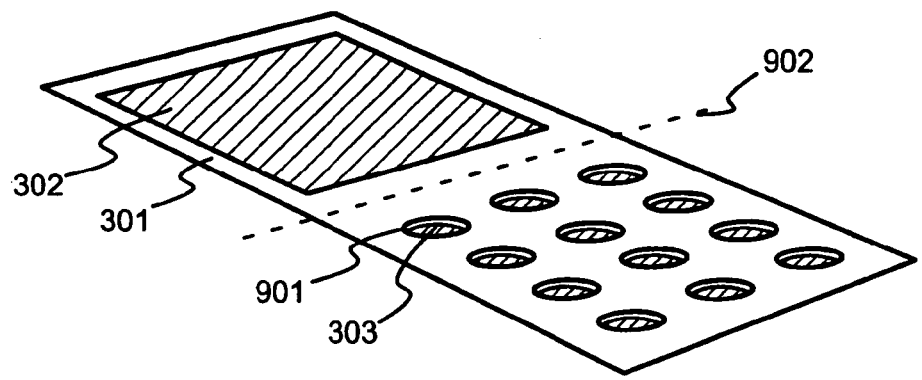
FIG. 9 illustrates how a flex can be formed in order to produce a key pad type embodiment of the invention.
Figure 10:
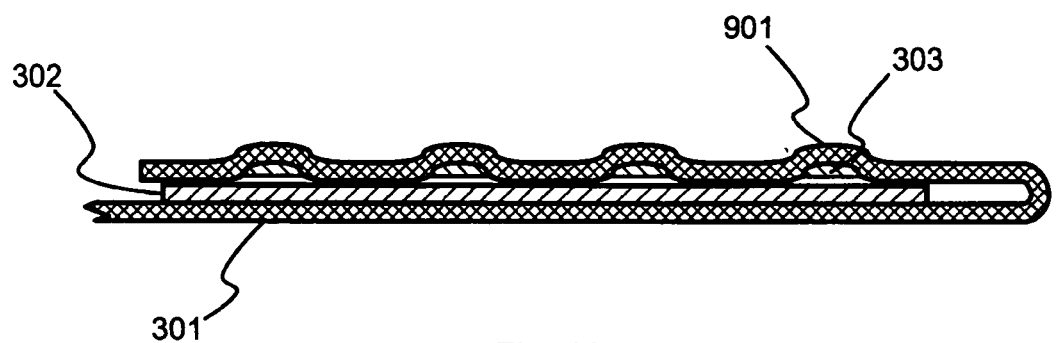
FIG. 10 illustrates utilizing a formed flex of the abovementioned kind in a key pad type embodiment of the invention.

FIGS. 9 and 10 illustrate an even simpler key pad type embodiment of the invention, which takes advantage of the fact that the polymer material of the flex is not only resilient under normal conditions but also appropriate for essentially permanent deformations, where "permanent" means that the deformation exists in a certain form when no forces act upon it, but it can be further elastically deformed by using a sufficiently weak force. Especially in the embodiment of FIGS. 9 and 10 there are formed, at one part of the flex 301, a number of domes 901. Each dome 901 is a kind of bubble-like formation, in which the material of the flex 301 bulges out from the plane defined by the otherwise planar form of the flex 301 in unbent state. The domes 901 may be produced e.g. by pinching the appropriate points of the flex 301 between a pair of mutually engaging concave and convex jaws, possibly applying also heat. If a completed dome 901 is pressed from its convex side, at least a central part of the dome bulges into the concave side, but the dome reassumes its original form when the pressing force is removed.

In FIG. 9 the flex 301 has a first conductive layer 302 on its first surface and a matrix arrangement (or any arrangement) of domes 901 next to the first conductive layer 301. A second conductive layer 303 comprises conductive patches on the concave sides of the domes 901. FIG. 10 is a cross-sectional view of the structure that results when the flex 301 of FIG. 9 is bent 180 degrees around the imaginary axis 902 midway between the first conductive layer 302 and the matrix of domes 901. It is easy to deduce that if in the structure of FIG. 10 one of the domes 901 is pressed from above, the conductive inside of that dome comes into contact with the part of the first conductive layer 302 immediately next to it.

In an analogous way with the touch pad type embodiments of the invention it is not important, what is the actual composition of the first and second layers 302 and 303. One basic category of layer compositions involves making the first layer 302 to comprise patches of intertwined fingers, so that when a key is pressed, the conductive inside of a downwards bulging dome causes an electrical connection between the intertwined fingers, without essentially any electric current flowing through the second layer 303. Another basic category calls for making the conductive inside of each dome the second pole of the switch in question, so that when the dome bulges downwards, electrical current flows between the first layer 302 and the second layer 303. Combinations and variations of these basic approaches are possible.

Figure 11:
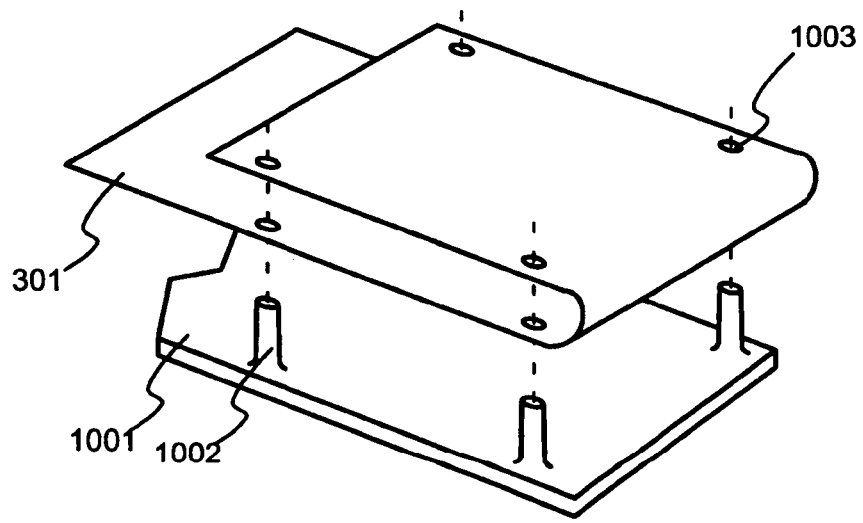
FIG. 11 illustrates the use of alignment holes and pegs in a portable electronic device according to an embodiment of the invention.

In practical electromechanical input means according to the invention, especially in touch pad type embodiments, it is important to keep the layers of the structure from moving in relation to each other. FIG. 11 illustrates a simple structural solution with which unintentional movement of the layers can be excluded. An electronic apparatus typically comprises an outer cover part 1001 or some other solid body part that acts as a support structure for the whole device. In FIG. 10 such a part comprises pegs 1002, and the flex 301 comprises holes 1003 along the sides of those parts of the flex that comprise the first and second layers (not shown in FIG. 10). In an assembled device the pegs 1002 go through the holes 1003 and keep the appropriate parts of the flex 301 from moving.

We will conclude by explaining certain structural solutions for portable electronic devices that employ electromechanical input means of the kind described above. FIGS. 12a, 12b, 12c and 12d together illustrate how a portable electronic device, particularly a portable telephone device can be built onto a flex 301. FIG. 12a illustrates one side of the flex with components attached thereto, FIG. 12b illustrates the opposite side of the flex with components, and FIG. 12c is a side view of the flex and the components when the flex has been bent into a form in which it will apper in a completed portable telephone device.

A central functional component of the portable telephone device is the so-called engine module 1201, which is a custom-built microprocessor. In the structure of FIGS. 12a, 12b, 12c and 12d the engine module 1201 is located at a central location on the surface of an elongated flex 301. At one end of the elongated flex 301 there is a display 1202, which is for example a liquid crystal display or a TFT (Thin Film Transistor) display. Electrical connections between the engine module 1201 and the display 1202 are realized as conductive tracks on the flex 301. In the present structure these connections go through a separate display interface module 1203, but it is possible to build all display-driving functions as a part of either the engine module 1201 or the display 1202, thus eliminating the need for any separate interface modules therebetween.

Another component on the flex 301 is a user interface module 1204, which implements the functional interface between the engine module 1201 on one hand and a loudspeaker 1205, a microphone 1206 and electromechanical input means on the other hand. The last-mentioned comprise first and second layers 302 and 303 on one surface of the flex 301. There is also a power interface module 1207 and a battery connector 1208 attached to the flex 301 and having electrical connections to the engine module 1201. A yet another component on the flex 301 is a radio frequency module 1209, which comprises at least an antenna and certain radio frequency components connected thereto in order to enable the portable telephone device to set up and maintain radio connections with base stations.

During an assembly stage the flex 301 is bent 180 degrees around axes 902 and 1210, so that if the bending starts from the position shown in FIG. 12b, both ends of the flex are bent "outwards" from the plane of the drawing. In the completely bent form shown from one side in FIG. 12c the bottom of the radio frequency module 1209 coincides with one part of the bottom of the engine module 1201, which facilitates direct connections through vias in the flex 301 between the radio frequency module 1209 and the engine module 1201. A battery pack 1211 is to attached to the battery connector 1208 so that a planar surface of the battery pack 1211 becomes a mechanical support surface of that part of the flex 301 that comprises the first and second layers 302 and 303 of the electromechanical input means. In other words, when the electromechanical input means are operated by touching and/or pressing, the mechanical stiffness of the battery pack 1211 keeps the whole flex 301 from bending to any macroscopical extent.

Also visible in FIG. 12b are the electrode strips 1212 and 1213 along the "north" and "south" sides respectively of the first layer 302, and the electrode strips 1214 and 1215 along the "east" and "west" sides respectively of the second layer 303. In this embodiment we assume, in other words, that the electromechanical input means comprise a touch pad based on continuous layers of known homogenous resistivity, which is one of the functional principles of touch pads known as such from prior art.

FIG. 12d illustrates how the completed flex is placed between two outer cover parts 1221 and 1222. The upper outer cover part 1221, which will cover the electromechanical input means, must be designed to allow a human user to operate the elecromechanical input means. For example, the upper outer cover part 1221 may be made thin and flexible enough at the location 1223 that will cover the electromechanical input means, so that the last-mentinoned can be operated through the outer cover part 1221. Alternatively there may be an opening or a separate, thin shielding window attached to the outer cover part 1221 to enable operating the electromechanical input means.

Figure 13:
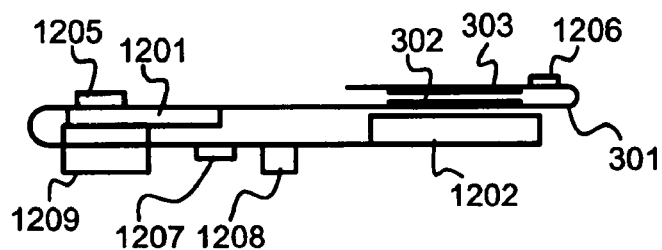
FIG. 13 illustrates an alternative way of placing components and bending a flex in a portable electronic device according to an embodiment of the invention.
Figure 14:
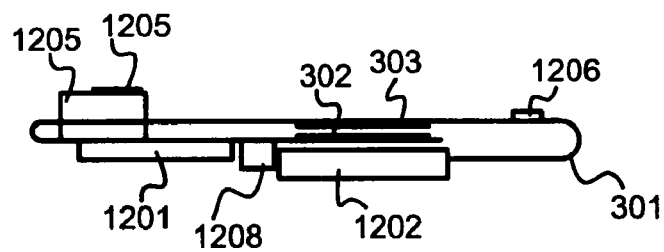
FIG. 14 illustrates another alternative way of placing components and bending a flex in a portable electronic device according to an embodiment of the invention and FIG. 15 illustrates schematically a method according to an embodiment of the invention.

FIGS. 13 and 14 illustrate certain variations of how the components can be placed and how the flex could be bent in a portable electronic device according to the invention. Reference designators are the same as in previous figures. The embodiments of both FIGS. 13 and 14 include the assumption that the flex 301 is transparent and can be folded over the visible side of a display 1202, so that said display and the first and second layers 302 and 303 of the electromechanical input means actually implement a touch-sensitive display. In FIG. 13 the flex 301 is bent into an S-like form, while in FIG. 14 the flex is on a "roll". Corresponding alternative embodiments can be presented also without assuming that the display and the electromechnical input means should be stacked on top of each other.

Figure 15:
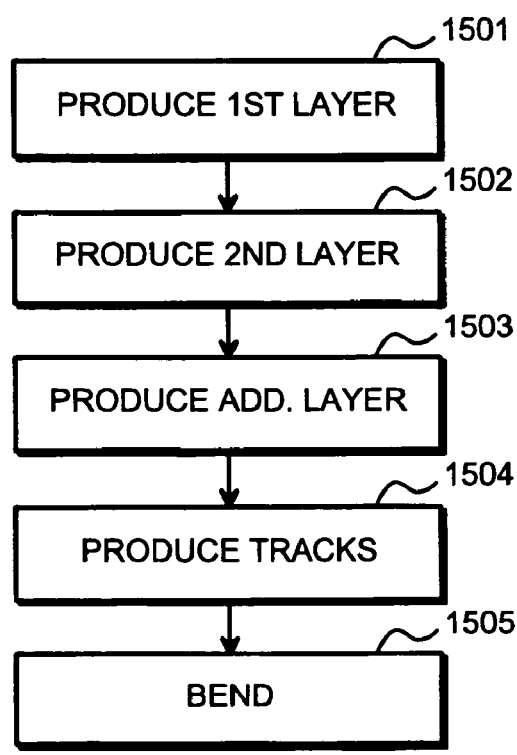

FIG. 15 is a simple schematical illustration of a method according to an embodiment of the invention. It comprises the steps of:
  producing 1501 a first layer of conductive or resistive material onto a surface of a dielectric support layer,
  producing 1502 a second layer of conductive or resistive material onto a surface of the same dielectric support layer, into a non-overlapping location with said first layer,
  producing 1503 an additional layer of insulating material on top of at least one of said first and second layers to act as resilient isolation means,
  producing 1504 conductive connections onto said dielectric support layer to facilitate conveying electric input means produced in said first and second layers to other parts of the portable electronic device and
  bending 1505 the dielectric support layer into a position in which said first and second layers at least partly overlap each other.

The mutual order of steps 1501 and 1502 can be changed, and step 1504 can be placed before steps 1501 and 1502, between them or directly after them. Step 1503 is not necessary if the structure to be produced does not require an additional layer to act as resilient isolation means.

In the description above the applicability of the invention has been illustrated with specific examples, but these should not be construed as limiting. For example, the dielectric support layer for the first and second layers has been consistently referred to as a flex; however, the same principle of allowing at least a part of the dielectric support layer of a first layer to continue past the first layer and bending it back to act as the dielectric support layer for the second layer can be realised with any dielectric material having suitable flexibility. The specific advantages of using a flex are related to the possibility of using the very same flex also as the carrier of conductive tracks, vias and connection patches so that in an optimal case only a single dielectric support layer is needed for all electrically functional components of a portable electronic device. Similarly while the description has consistently referred to an additional layer between the first and second layer, which additional layer should act as resilient isolation means, such a layer is not actually necessary if the first and second layers can be kept at a suitable distance from each other with other means, like using a supportive rim along their perimeter and counting on the resilience of the dielectric support layer.

I claim:

1. An electromechanical input device for a portable electronic device, comprising:
  a first layer of conductive or resistive material,
  a second layer of conductive or resistive material, which second layer at least partly overlaps the first layer so that the overlapping parts of the first and second layers together are responsive to touching or pressing to produce an electric input signal to the portable electronic device,
  a dielectric support layer for the first layer, and
  a dielectric support layer for the second layer;
  wherein at least a part of the dielectric support layer for the first layer continues passed the first layer and is bent back to act as the dielectric support layer for the second layer.

2. An electromechanical input device according to claim 1, wherein the dielectric support layer for the first layer and the dielectric support layer for the second layer are portions of a flexible printed circuit board that also comprises conductive tracks for realizing electrical connections between components attached to said flexible printed circuit board.

3. An electromechanical input device according to claim 1, wherein the overlapping parts of the first and second layers constitute a touch pad.

4. An electromechanical input device according to claim 3, additionally comprising an additional layer between the first and second layers, which additional layer acts as resilient isolation means between the overlapping parts of the first and second layers.

5. An electromechanical input means according to claim 1, wherein the overlapping parts of the first and second layers constitute a key pad.

6. An electromechanical input means according to claim 5, wherein:
  the part of the first layer that overlaps with the second layer comprises patches of intertwined, conductive fingers and
  the part of the second layer that overlaps with the first layer comprises conductive patches at locations that coincide with said patches of intertwined, conductive fingers in the first layer;
so that the overlapping parts of the first and second layers are responsive to pressing to produce an electric input signal that results from a galvanic connection which a conductive patch in the second layer causes between fingers in the first layer.

7. An electromechanical input means according to claim 5, wherein the dielectric support layer for the second layer comprises dome-shaped deformations each having a convex side and a concave side, of which the concave sides of the dome-shaped deformations are towards the first layer and comprise the second layer in the form of conductive patches.

8. An electromechanical input device according to claim 1, additionally comprising other layers that are conductive or resistive and supported by a dielectric layer that is of the same piece of material as the dielectric support layer of the first and second layers.

9. An electromechanical functional module for a portable electronic device, comprising:
  a flexible printed circuit board for supporting electronic components and conductive tracks between electronic components,
  a first layer of conductive or resistive material on a surface of the flexible printed circuit board, and
  a second layer of conductive or resistive material on a surface of the flexible printed circuit board;
  wherein a portion of the flexible printed circuit board separates the first layer from the second layer, thus allowing the flexible printed circuit board to be bent around an imaginary axis crossing said portion of the flexible printed circuit board, so that after bending the second layer comes to at least partly overlap the first layer, and the overlapping parts of the first and second layers together are then responsive to touching or pressing to produce an electric input signal to the portable electronic device.

10. An electromechanical functional module according to claim 9, wherein the flexible printed circuit board also comprises electronic components attached thereto, and the conductive tracks connect at least one of said electronic components to the first and second layers for allowing electric input signals produced in the first and second layers to propagate to at least one of said electronic components.

11. An electromechanical functional module according to claim 9, wherein the first and second layers are located on a same surface of the flexible printed circuit board, so that bending the flexible printed circuit board 180 degrees around an imaginary axis crossing said portion of the flexible printed circuit board brings the first and second layers against each other with no part of the flexible printed circuit board therebetween.

12. An electromechanical functional module according to claim 11, additionally comprising an additional layer on top of at least one of the first and second layers, so that bending the flexible printed circuit board 180 degrees around an imaginary axis crossing said portion of the flexible printed. circuit board brings the first and second layers against each other with said additional layer therebetween.

13. An electromechanical functional module according to claim 9, wherein the first and second layers are located on different surfaces of the flexible printed circuit board, so that bending the flexible printed circuit board 180 degrees around an imaginary axis crossing said portion of the flexible printed circuit board brings the first and second layers into a stack where a part of the flexible printed circuit board lies between the first and second layers.

14. An electromechanical functional module according to claim 9, comprising the following components attached to the flexible printed circuit board:
   an engine module of a portable telephone device,
   a display,
   a microphone and
   a loudspeaker.

15. A portable electronic device, comprising:
   a flexible printed circuit board,
   an engine module, which is a microprocessor, attached and electrically connected to the flexible printed circuit board, and
   electromechanical input device for producing electric input signals for the engine module;
wherein the electromechanical input device comprises a first layer of conductive or resistive material on a surface of the flexible printed circuit board, and a second layer of conductive or resistive material on a surface of the flexible printed circuit board, which second layer at least partly overlaps the first layer, and wherein the flexible printed circuit board acts as a dielectric support layer for the first layer and continues passed the first layer and is bent back to act as the dielectric support layer for the second layer.

16. A portable electronic device according to claim 15, additionally comprising a battery pack having a planar side surface, which battery pack is located with its planar side surface parallel to the first and second surfaces on an opposite side of the flexible printed circuit board than the first and second surfaces, so that said planar side surface of the battery pack acts as a mechanical support for the flexible printed circuit board at the location of the overlapping parts of the first and second layers.

* * * * *

UNITED STATES PATENT AND TRADEMARK OFFICE
CERTIFICATE OF CORRECTION

| | |
|---|---|
| PATENT NO. | : 7,295,189 B2 |
| APPLICATION NO. | : 10/749062 |
| DATED | : November 13, 2007 |
| INVENTOR(S) | : Östergard |

Page 1 of 1

It is certified that error appears in the above-identified patent and that said Letters Patent is hereby corrected as shown below:

At column 13, line 24, claim 12, line 5, delete the "." after the word "printed".

At column 13, line 27, claim 13 should be deleted as same was previously withdrawn and should subsequently be canceled.

Signed and Sealed this

Twentieth Day of May, 2008

JON W. DUDAS
*Director of the United States Patent and Trademark Office*